Figure 1:
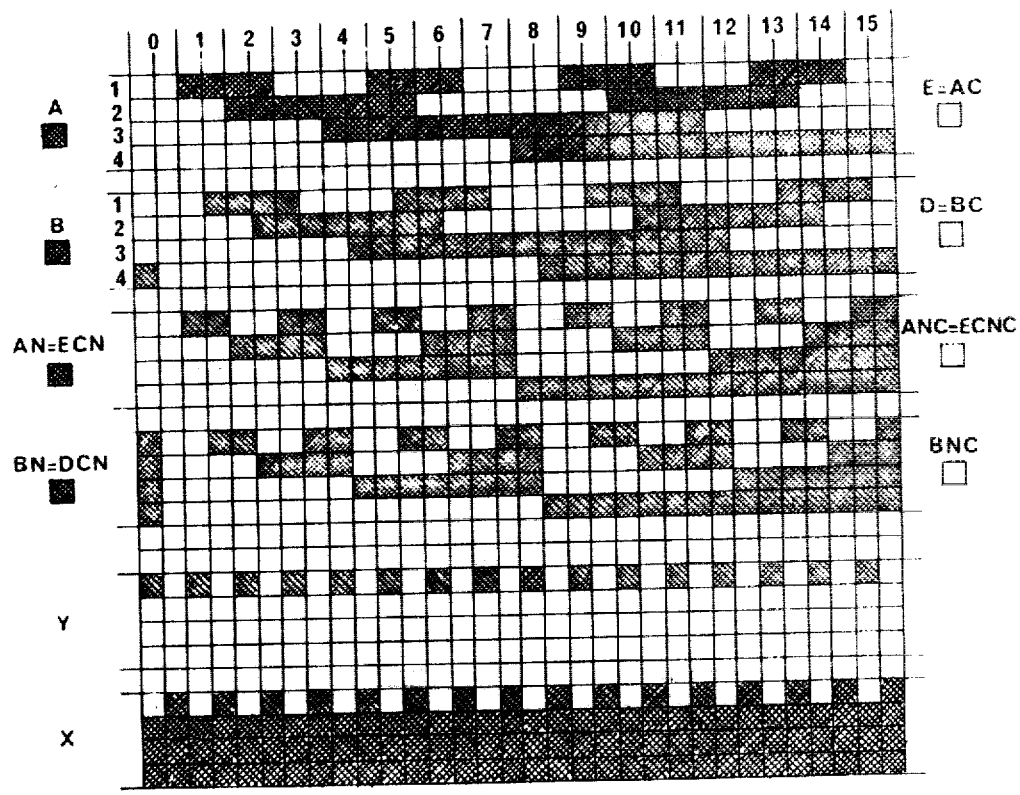

United States Patent [19]

Taillebois

[11] 4,311,987
[45] Jan. 19, 1982

[54] VALIDITY CHECK PROCESS FOR DATA SUPPLIED BY DIGITAL DISPLACEMENT DETECTORS AND DETECTORS USING THIS PROCESS

[75] Inventor: Jacques A. J. Taillebois, Plaisir, France

[73] Assignee: M.C.B., Courbevoie, France

[21] Appl. No.: 912,183

[22] Filed: Jun. 5, 1978

[30] Foreign Application Priority Data

Jun. 14, 1977 [FR] France .................. 77 18200

[51] Int. Cl.$^3$ .............................................. G08C 9/00
[52] U.S. Cl. .................................. 340/347 P; 371/68
[58] Field of Search ..... 340/347 P, 347 M, 146.1 BE; 235/306, 307; 371/68

[56] References Cited

U.S. PATENT DOCUMENTS

| | | | |
|---|---|---|---|
| 2,793,807 | 5/1957 | Yaeger | 340/347 M |
| 2,986,726 | 5/1961 | Jones | 340/347 P |
| 3,143,730 | 8/1964 | McIntyre | 340/347 P |
| 3,156,911 | 11/1964 | Ziserman | 340/347 P |
| 3,913,094 | 10/1975 | Wootton | 340/347 M |

FOREIGN PATENT DOCUMENTS 1549265  4/1971  Fed. Rep. of Germany .

*Primary Examiner*—Charles D. Miller

[57] ABSTRACT

A checking process for data supplied by a digital detector with coded tracks. This detector is designed to supply two words of the same format: one word A in Gray code and one word D in Gray code complemented and shifted back by a half coding point. The apparatus includes the numerical deviation is checked between the two words supplied by detector correspondingly to the geometric shift provided by means of conversion levels in natural binary code complementation code as well as an adder and a coincidence gate supplying a validation signal.

12 Claims, 7 Drawing Figures

Fig.2
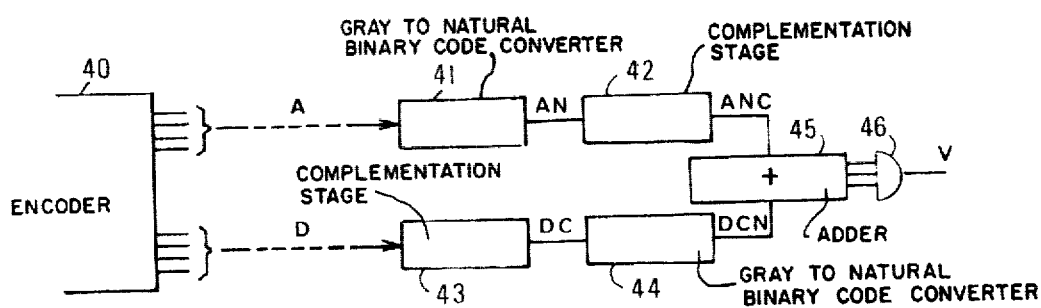
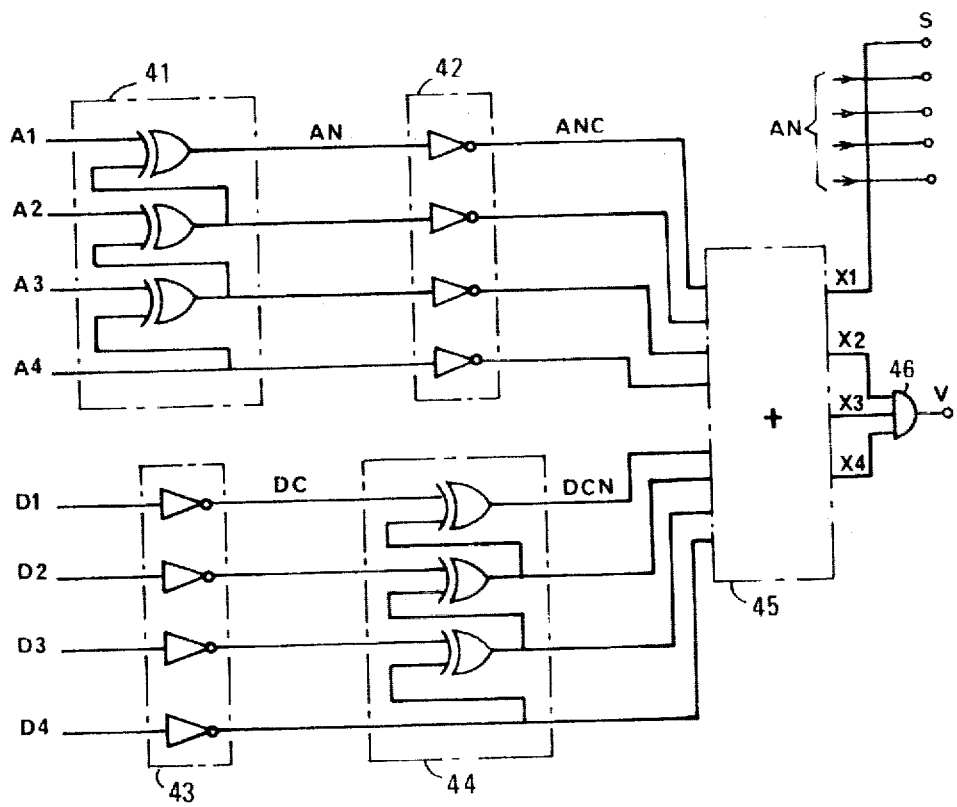
Fig.3

VALIDITY CHECK PROCESS FOR DATA SUPPLIED BY DIGITAL DISPLACEMENT DETECTORS AND DETECTORS USING THIS PROCESS

The growing use of equipment in which displacement detectors play a major role not only requires that they be extremely dependable, but also, especially in so far as the accuracy of the data which they supply is concerned.

Since the detector is the unit which receives or detects variations in physical magnitude and produces a variable signal representative of this parameter (a signal which will be processed by the equipment), it is absolutely necessary that the data supplied by these detectors be checked and validated for use in equipment in which reliability is important.

Digital displacement detectors like, shaft position or linear encoders develop a coded signal. Codes known as error "self-detecting" or "self-correcting" codes allow detection and occasionally correction of errors. But, in all of these codes, many bits change at the same time between two contiguous words; these are consequently ambiguous codes which, as a result, may only be used in synchronous systems. Since displacement coders are asynchronous devices, it is worthwhile using a non-ambiguous code.

The Gray code, which is a reflected code, is also an unambiguous code. This is a major advantage for use in coders and for the transmission of data supplied by a coder. The use of a code other than the Gray code i.e. in an optical coder, requires that for a given resolution, a greater number of tracks as well as optical-electronic and electronic components be available. The resolution/dependability ratio reaches its optimal point when the Gray code is used.

Automatic error detecting codes which are either known or studied by various authors are all based upon the principle of parity between all of the bits in a word transmitted or between some bits of a word, taken n to n. The addition of parity bits to the Gray code would lead to ambiguity in reading; this ambiguity must be dispensed with, and parity must be handled by studying the possibilities of interaction between both.

The purpose of the invention is to permit the use of a reflected code in a digital displacement detector and to ensure validity checking of data produced by the detector in a simple and dependable fashion.

To this end, the invention deals with a process which consists in creating, within the detector, data made up of two words in reflected code, more specifically in Gray code, whose spacing is known. A double reading of the coded track on the moving part of the detector is then carried out, that is, an initial reading followed by a second reading shifted in space with respect to the first and of a known quantity falling between an integer, which may be 0, of coding points and said integer plus one unit. Checking is then carried out to ensure that the two words thus created present a numerical difference that corresponds to the shift between the two readings so as to validate the data supplied by the detector. The shift within the detector, which is chosen to be equal to a non-integer, makes it possible to respect the requirement of unambiguity, for both words cannot change conditions simultaneously.

Once a certain type of reflected code has been chosen, both words may be supplied by the detector in reflected code or in diminished radix complement code. It helps for one of the two words to be in reflected code and the other in diminished radix complement code as a cause of error common to both words would have the reverse effect on both of them and the error would be more easily detected. Preferably, we would convert each of the two words, or its diminished radix complement if supplied, into diminished radix complement code, or in a word, into weighted code, like the natural binary code. These converted words are compared to determine the difference. This comparison may be carried out by combining said words by means of simple mathematical operations (addition or subtraction) such that their result would normally include only identical bits, excluding the lowest order bit, and, possibly, the highest order bit if it does not fall within the format of the words compared. It is obvious that a combination of words so chosen makes it possible to simply and easily carry out comparison and validation.

Thus, we may subtract the second word, produced by the shifted, delayed reading along the coded tracts, from the first word. Then, after having subtracted the integer cited above from the result (providing that it is not 0) expressed in natural binary code, we check that all of the bits in the result thus obtained are equivalent to 0, except for the least significant and, perhaps, the most significant bits.

Retaining the natural binary code, we may also add the second word to the diminished radix complement of the first word, add said integer to the result and check that all of the bits in the final result, excluding the least significant and, possibly, the most significant bits, are equivalent to 1.

The least significant bit is not taken into consideration when comparing the words. Given the fact that the chosen difference is not equal to an integral number of coding points, but includes a fraction of a point, it is sometimes equal to 0, and sometimes equal to 1. This bit may be added to the coded data supplied by the detector to make up the least significant bit of the total coded information thus obtained, which causes the detector's resolution to double.

In order to improve error-detecting quality, we can also check that the difference between the two succeeding conditions of a single word supplied by the detector, preferably converted into weighted code, is equal to either 0 or 1.

The invention also concerns a digital detector which, when associated with a particular checking circuit, makes it possible to implement the process defined above. In the simplest example, this detector includes a moving element such as a rotating disc (shaft position encoder) which bears a set of tracks in Gray code (or in any other reflected code) and reading units for said tracks. Either an optical or an electrical contact brush coder may be used. Based on the invention, the digital detector is fitted with a double set of reading units. These two sets and the coded tracks offer a mutually determined geometric shift, equal to a whole number of coding points plus a fraction of a coding point (preferably a half-point), in such a way as to supply two numerically shifted words of the same format which are applied (possibly after remote transmission) to the checking circuit which verifies their numerical difference and supplies a validation signal when this difference corresponds to the geometric shift provided for in the detector.

The shift provided within the detector may be obtained by dividing the coding track into two groups of tracks shifted in space and by associating each set of reading units with a group of tracks. The two sets of reading units may then be aligned without mutual shifting, with the reading shift resulting from the shift in the two groups of coded tracks with respect to one another.

The shift may also be obtained without dividing the coded tracks on the moving element. In this case, it will bear a single group of coded tracks, as in standard coders. But two sets of reading units shifted in space along the coded tracks will be added to this single group.

In both cases, it helps for the shift, in both groups of coded tracks and/or reading units, either to be like the two words obtained, numerically shifted as stated above, or available in codes which complement one another, i.e. in Gray code and complemented Gray code.

As the invention provides for each of the detector checking and validation circuits to supply two words in Gray code or in complemented Gray code, it may include:

(a) two converters which convert the two words into natural binary code. Each converter is preceeded by a complementation level in the event that the corresponding word is supplied in complemented Gray code;

(b) or an adder receiving the second word corresponding to the delayed shifted reading directly from the converters, and the first word by way of a complementation level, or a subtracter receiving the two words directly from the converters and subtracting the second from the first;

(c) a coincidence gate comparing the two bits of the word formed by the adder or by the subtracter, excluding the least significant bit and, possibly, the most significant bit, and supplying a validation signal when these bits are either all equivalent to 1, or equivalent to 0 respectively;

(d) a level placed in front of said gate either to subtract or to add to this level the whole number of coding points included in the internal shift of the detector.

The process used as per the invention for validating data supplied by a digital detector, by the formation and comparison of two shifted words, and the corresponding digital detector present numerous advantages:

(a) both words are created without any ambiguity in the detector (in reflected code, like the Gray code), in such a way that the latter be well suited to the standard asynchronous operating mode for displacement detectors;

(b) the checking and validation of data supplied by the detector are extremely efficient, even though they are carried out in a very simple fashion through verification of the distance between two words;

(c) if both words are respectively in Gray code and in complemented Gray code, checking efficiency is increased and it becomes possible to detect maximum level flaws such as flaws effecting an entire series of components (power supply defects for example), as well as defects having the same influence on equally ranked bits in both words (defects due to interference during transmissions, for example);

(d) the set of both words may be transmitted as is and processed as close as possible to the point at which the data which it contains is to be used, in such a way that transmission defects are taken into consideration in validation checking;

(e) obtaining the second word shifted with respect to the first does not require that provision be made for a second set of coded tracks the first set suffices if the reading units are doubled;

(f) conversion into weighted code (natural binary code) is simple;

(g) if both words are shifted in space by a number of points equal to $n \pm \frac{1}{2}$, the coder's resolution is doubled;

(h) for equal resolution, fewer components are needed than for a natural binary coder (i.e., in order to obtain an 11 bit datum, one needs $1 + (2 \times 10) = 21$ natural binary readers with increased uncertainty, whereas now $2 \times 10 = 20$ readers are needed);

(i) the check may be carried out in combinational logic by means of conventional logical circuits, or in sequential logic, preferably by means of a micro-processor whose software need only be modified through the addition of a sub-program for checking and validating the data;

(j) in addition to checking the distance between the two words, it is possible to check the distance between two pieces of information one of which follows the other in time;

(k) the two words of the same format created by the coder may be used independently of one another and of any check, as is the case in a conventional coder in Gray code;

(l) the cost of a coder as per the invention is only slightly higher than that of a coder in conventional Gray code, and its dependability is not particularly decreased, at least not any more than in those cases in which a natural binary code is used;

(m) the cost of a checking circuit is low.

The following description will enable you to fully understand how the invention may be put to use, by refering to the drawings appended as non-limitative examples.

Figure 7:
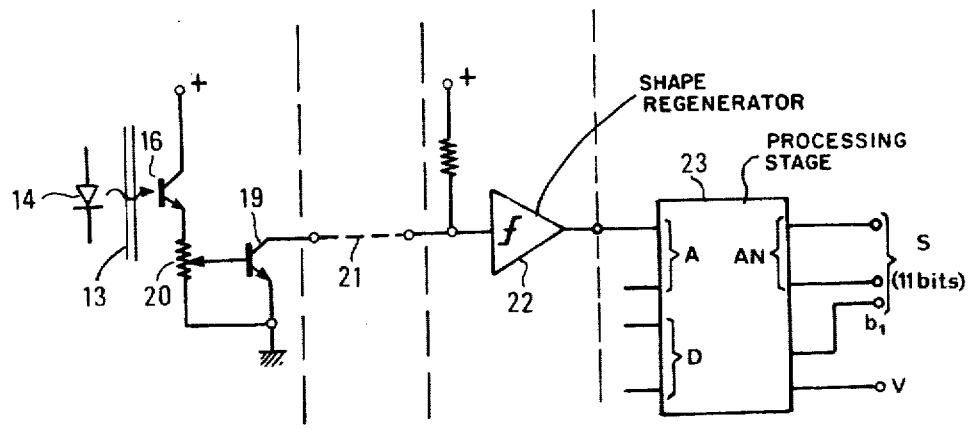
Figure 4:
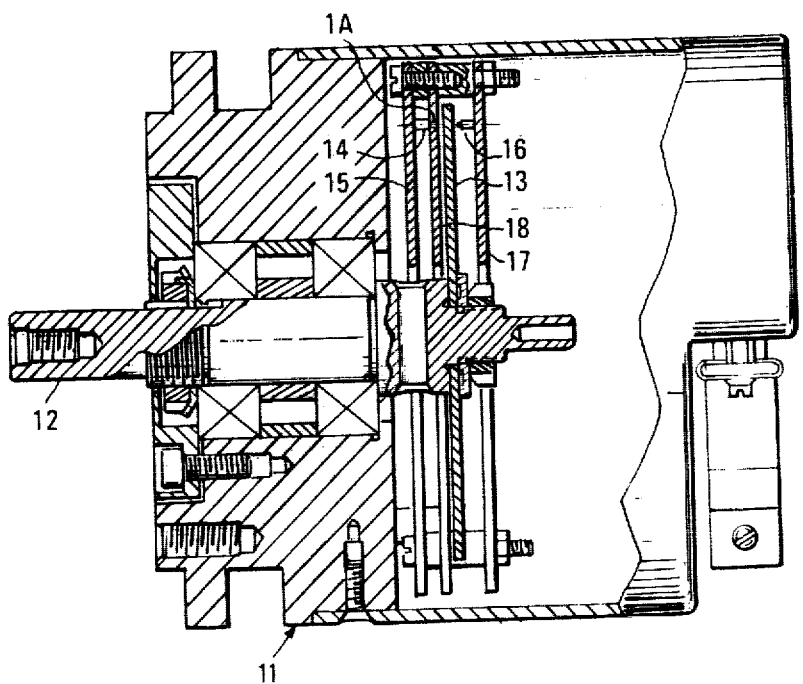
Figure 6:
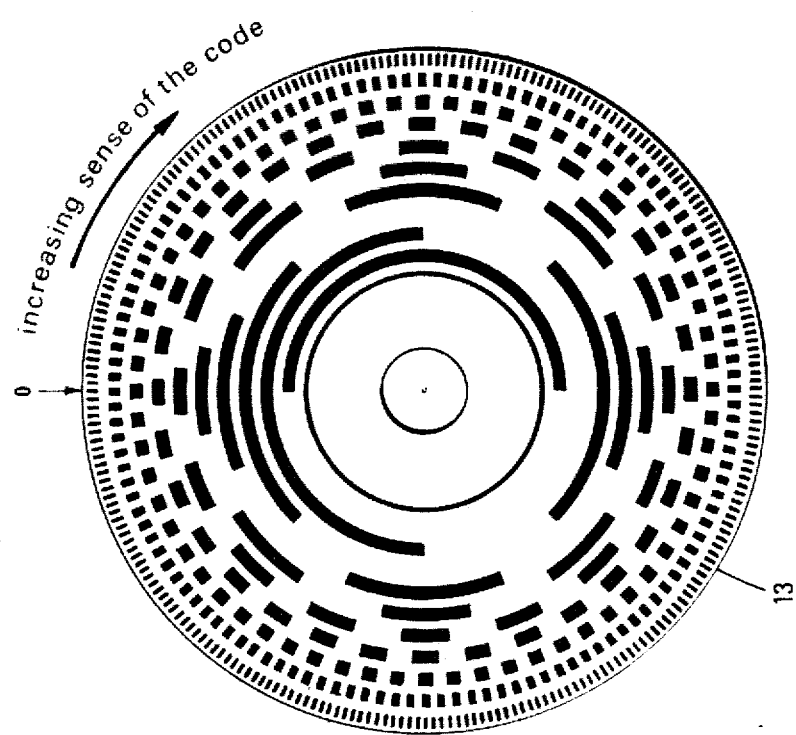
Figure 5:
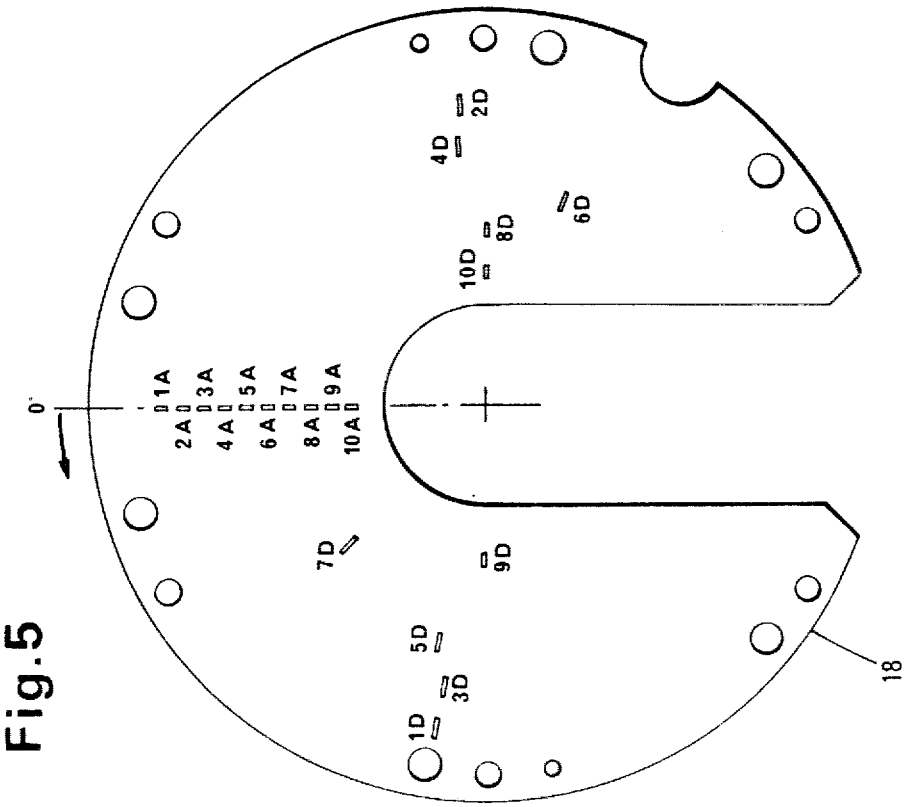

FIG. 1 is a diagram illustrating the process as per the invention for checking and validation of data supplied by a digital detector with coded tracks, FIGS. 2 and 3 are respectively a schematic diagram and a detailed diagram of a four bit data checking circuit, FIG. 4 shows a cross-section of an angular digital displacement detector used to implement the process as per the invention, FIG. 5 shows the reticle of the detector in FIG. 4, FIG. 6 is a plan view of the coded disc of the detector in FIG. 4, FIG. 7 is an electronic wiring diagram attached to each reader of the detector in FIG. 4 and linked to the checking circuit.

We are first going to explain the principle behind the checking process as per the invention by reference to FIG. 1., and in relation to a 16 point digital angular displacement detector, having moving disc carrying two groups of four coded tracks 1, 2, 3, 4. The first group corresponds to a Gray A code; or a complemented E Gray code and the second group to a Gray B or a complemented D Gray code, shifted a half-point back with respect to the first group's code. In FIG. 1, the 1 of codes A and B corresponds to the cross-hatched areas and the 0 to the blank spaces, while the reverse is true for codes E and D.

The reading units are aligned along a radius of the disc, and one of them supplies a word in code A or E and the other a word in code B or D. These words are (down to the nearest complementation) sometimes identical (when we read the point right hand column of each) and sometimes different by one least significantly ranked unit (if we read the left hand column of each point). The difference between the two words is thus equivalent to ½. This value is most favorable for clear discrimination of the two portions of each point resulting from the shift of a fraction of a point between the two groups, such discrimination being carried out by the reading units.

Below, the addition of the letter N to a code symbol signifies that we are converting it into natural binary code, and the addition of the letter C indicates that we are taking its diminished radix complement.

In the case where we have chosen codes A and B, the first four bit word obtained in Gray A code is converted into the natural binary code AN, then complemented, yielding a word in code ANC corresponding to the diminished radix complement of the word in code AN. The second four bit word obtained in code B is converted into natural binary code (code B).

All that is then needed is to add word ANC to word BN, as is shown in the table below which corresponds to the initial two points:

|  | Point 0 | | Point 1 | |
|---|---|---|---|---|
|  | 1st Configuration | 2nd Configuration | 3rd Configuration | 4th Configuration |
| Code ANC | 1 1 1 1 | 1 1 1 1 | 1 1 1 0 | 1 1 1 0 |
| Code BN | 1 1 1 1 | 0 0 0 0 | 0 0 0 0 | 0 0 0 1 |
| X = ANC + BN | (1)1 1 1 0 | 1 1 1 1 | 1 1 1 0 | 1 1 1 1 |

(any number which has to be carried over and does not fall within the format is not taken into consideration).

We note that all of the bits of result X are 1 except for the lowest order bit which is sometimes 1, sometimes 0, and we need only check this to produce the validation signal.

We can also carry out modulo 2 subtraction of AN and BN words resulting from the conversion of words A and B into natural binary code. The following table shows the result for the initial two points:

|  | Point 0 | | Point 1 | |
|---|---|---|---|---|
|  | 1st Configuration | 2nd Configuration | 3rd Configuration | 4th Configuration |
| Code AN | 0 0 0 0 | 0 0 0 0 | 0 0 0 1 | 0 0 0 1 |
| Code BN | 1 1 1 1 | 0 0 0 0 | 0 0 0 0 | 0 0 0 1 |
| Y = AN − BN | 0 0 0 1 | 0 0 0 0 | 0 0 0 1 | 0 0 0 0 |

Here, we have validation when all of the bits are 0, except the lowest order bit which is either 0 or 1, alternatively.

More generally, and depending upon whether the first code is a Gray A code or a complemented Gray E code and wheter the second code (shifted back) is a Gray B code or a complemented Gray D code, we can form quantities X and Y as per the following table:

| Codes read | X | Y |
|---|---|---|
| A, B | ANC + BN | AN − BN |
| A, D | ANC + DCN | AN − DCN |
| E, B | ECNC + BN | ECN − BN |
| E, D | ECNC + DCN | ECN − DCN |

If the shift within the detector includes a whole number of coding points, which is not the case in the above example, this number has to be subtracted from Y or added to X.

The simple mathematical operations carried out on the codes read are solely intended to allow easy verification of the fact that the difference between the two words read must be equal to 0 or to a unit. Other processing modes may, of course, be imagined.

FIGS. 2 and 3 show how the comparison of two words read in codes A and D in a coder 40 may be carried out. The word in code A is converted by a converter 41 into a AN natural binary code, then a complementation level 42 gives its ANC diminished radix complement. The word in code D is complemented in a level 43, then the resulting DC word is converted into DCN natural binary code by a converter 44. The quantity X = ANC + DCN is formed by a adder 45 and a coincidence gate 46 supplied a validation signal V when all of the bits, excluding the least significant bit, are equal to 1.

FIG. 3 gives a more detailed look at a circuit which may be used in practice. The four bits $A_1$ through $A_4$ of the word in code A supplied by the coder are converted into AN natural binary code in the converter 41 fitted with three exclusive OR gates, followed by the complementation level 42 fitted with four logical NOT circuits. The same elements are used to process the four bits $D_1$ through $D_4$ of the code D word, but in reversed order (which yields a certain symmetry and equivalent routing time for the two processing channels). The adder 45 supplies the four bits $X_1$, $X_2$, $X_3$, $X_4$, of quantity ANC+DCN (any carry over not falling within the format is simply dropped). The three bits $X_2$, $X_3$, and $X_4$, are applied to the AND gate 46 which supplies a validation signal V equal to 1 when these three bits are all equal to 1. The first bit, $X_1$, equal to 1 or 0 depending on whether or not it is the first or second half of a point, is added to the four bits of the AN word to form the lowest order bit of a word S with five bits coded in natural code and constituting the final result of the coder 40 whose resolution is consequently doubled. This word S is not taken into consideration unless the validation signal V is equal to 1; if this signal is equal to 0, the word S is rejected as erroneous.

The processing set forth above is carried out in combinational logic. This processing may also be carried out in sequential logic, with the two words supplied by the coder being read simultaneously and processed periodically, preferably by means of a microprocessor. In sequential logic, it is possible to carry out an additional check, which consists in verifying that the difference between two words consecutive in time (i.e. in AN code) is really equivalent to 0 or to 1 (i.e. $AN_n - AN_{n-1} = 0$ or $\pm 1$). We can also envisage putting both processing modes to work at the same time i.e. by carrying out certain operations at the same time in wired logic and other processing operations with the help of a microprocessor. FIGS. 4 through 6 supply an example of an angular optical coder making use of the process as per the invention. This coder, with 1024 resolution points, is made up of a case 11 in which is mounted a rotatable shaft 12, upon which a conventional coded disc 13 FIG. 6 is concentrically secured. The disc 13 has ten tracks which offer alternatively blank and opaque zones, the latter correspond to logic 0) arranged as per a Gray code and read by means of a set of ten stationary readers aligned radially. Each reader includes an electro-luminescent diode 14 secured to a plate 15 and a phototransistor 16 secured to a plate 17 and lit by diode 14 by means of the corresponding track of coded disk 13 and the corresponding slot of a series of slots 1A through 10A set up in radial alignment in plate 18 forming a reticule (FIG. 5). This set of 10 readers associated with slots 1A through 10A constitutes the first set of reading units supplying the first word in Gray code.

A second set of reading units is provided to supply the second word is complemented D shifted Gray code. This second set is made up of ten readers identical to the ten readers cited above, each of which is associated in the same way to one of the ten tracks of coded disk 13. However, the readers are not aligned, but arranged in such a way as to supply a code D which is the complement of code A and which is shifted back a half point with respect to the latter. Their positions correspond to the positions of slots 1D through 10D which are associated with them, as indicated in FIG. 5 and as per the following table.

| Slot | Shaft positions |
| --- | --- |
| 1D | 80° 41' |
| 2D | 274° 03' |
| 3D | 81° 23' |
| 4D | 275° 27' |
| 5D | 78° 34' |
| 6D | 247° 19' |
| 7D | 44° 49' |
| 8D | 269° 49' |
| 9D | 89° 49' |
| 10D | 269° 49' |

These shaft positions are counted starting with readers 1A through 10A (position 0°) in the opposite direction from the increasing direction of the Gray A code. It is quite obvious that many other combinations of shaft positions will give the same result.

Thus, starting with a single coded disk 13 with ten tracks, the two sets of readers make it possible to obtain a word in Grey code and a word in complemented Grey code shifted back a half point.

FIG. 7 is a schematic representation of the electrical circuit associated with each reader. The signal produced by the phototransistor 16 is applied to amplifier transistor 19 by means of level adjusting potentiometer 20. Elements 19 and 20 are placed inside case 11, on plate 17. The amplified signal is then shaped by circuit 22, and possibly after having followed a remote transmission channel 21. The outputs of the twenty circuits 22, where the two ten bit words in code A and D corresponding to each position of coded disk 13 are connected to the processing circuit 23. The latter determines the difference between these two words and supplies a validation signal V when the difference determined corresponds to the half point difference provided for within the coder. Furthermore, it supplies a bit $b_1$ equal to 0 or 1 depending on whether or not the code A readers are opposite the first or second half of a coding point. This signal is added to the word in AN code (natural binary code) produced in circuit 23 in the form of a lowest order bit, and the whole constitutes a code S with eleven bits doubling the coder's resolution, which is thus increased to 2048 points.

I claim:

1. A digital displacement detector with a validity check system, the detector having a movable member bearing a set of coded tracks, a first reading device registering with at least one track of said set of tracks and arranged to provide a first word of digital information in a reflected code identifying the position of the movable member relative to the reading device, a second reading device arranged to provide a second word of digital positional information having the same number of bits as the first word and corresponding to a position spaced along the tracks from the position indicated by the first word by a predetermined amount which is a non-integral number of lowest order digital divisions along the tracks, and a checking circuit for checking that the two words have a numerical difference corresponding to said predetermined amount of spacing.

2. A detector as claimed in claim 1 wherein said set of coded tracks has two groups of tracks separated in space, each said reading device being associated with a respective one of the groups.

3. A detector as claimed in claim 1 wherein the movable element has a single group of tracks, both said reading devices being associated with said single group at different positions along the tracks.

4. A detector as claimed in claim 1 wherein the reading devices are positioned relative to the group or groups of tracks in such a way that the words provided by the reading devices are in mutually complementary codes.

5. A detector as claimed in claim 1 wherein said non-integral number is equal to $(n+\frac{1}{2})$ where n is an integer or zero.

6. A detector as claimed in claim 1 wherein the checking circuit comprises convertors for transforming said words into natural binary code, a complement circuit for providing the complement of the numerically higher one of said binery words, an adder for adding together said complement word and the numerically lower one of said binary words, any bit of higher order than those of said two words being discarded from the sum, means for adding to the sum an integer equal to the integral part of said non-integral number of lowest order digital divisions, and a coincidence gate for providing a validation signal when all bits except the lowest order bit of the resulting word are equal to "1".

7. A detector as claimed in claim 1 wherein the checking circuit comprises convertors for transforming said words into natural binary code, a subtractor for subtracting the numerically lower one of said binery words from the numerically higher, mens for substracting from the difference an integer equal to the integral part of said non-integral number of lowest digital divisions, and a coincidence gate for providing a validation signal when all bits except the lower order bit of the resulting word are equal to "0".

8. A detector as claimed in either of claims 6 or 7, wherein one of the two words provided by the reading devices is in Gray code and the other is in complemented Gray code, and including a complement circuit to reverse the complemented Gray code word to natural Gray code before supplying it to one of the binary convertors.

9. A detector as claimed in claim 7, wherein said non-integral number of lowest order digital divisions is less than 1, and said means for subtracting said integer, or said means for adding said integer as the case may be, is omitted.

10. A detector is claimed in any of claims 1 wherein the checking circuit employs at least in part combinational logic.

11. A detector as claimed in claim 1, wherein the checking circuit employs at least in part sequential logic.

12. A detector as claimed in any of claim 1 wherein the checking circuit further includes means for verifying that, for at least one of the two words provided, the difference between successive conditions of the word is 0 or 1 lowest order unit.

* * * * *